(12) United States Patent  
Okazaki

(10) Patent No.: US 6,327,077 B1  
(45) Date of Patent: Dec. 4, 2001

(54) OPTICAL DIRECT AMPLIFIER DEVICE AND BIDIRECTIONALLY PUMPED OPTICAL DIRECT AMPLIFIER DEVICE

(75) Inventor: Hideya Okazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/391,048

(22) Filed: Sep. 7, 1999

(30) Foreign Application Priority Data

Sep. 29, 1998 (JP) .................................. 10-275680  
Sep. 29, 1998 (JP) .................................. 10-275704

(51) Int. Cl.$^7$ ...................................... H01S 3/00  
(52) U.S. Cl. ................................ 359/341; 359/124  
(58) Field of Search ............................ 359/341, 345, 359/124

(56) References Cited

U.S. PATENT DOCUMENTS

| | | | |
|---|---|---|---|
| 5,367,587 | * 11/1994 | Mizuochi et al. | 385/27 |
| 5,581,397 | * 12/1996 | Maki et al. | 359/341 |
| 5,801,878 | * 9/1998 | Bourret et al. | 359/341 |
| 5,875,054 | * 2/1999 | Onada et al. | 359/341 |

FOREIGN PATENT DOCUMENTS

| | | |
|---|---|---|
| 63-197131 | 8/1988 | (JP) . |
| 4-22928 | 1/1992 | (JP) . |
| 4-37729 | 2/1992 | (JP) . |
| 5-136495 | 6/1993 | (JP) . |
| 5-268166 | 10/1993 | (JP) . |
| 7-99477 | 4/1995 | (JP) . |
| 8-304860 | 11/1996 | (JP) . |
| 9-97940 | 4/1997 | (JP) . |

OTHER PUBLICATIONS

Electronic Communications Society Technology Research Report 95 [343] pp. 67–72 OCS95–86.

* cited by examiner

*Primary Examiner*—Mark Hellner  
(74) *Attorney, Agent, or Firm*—Scully, Scott, Murphy & Presser

(57) ABSTRACT

Output light beams from first and second laser diodes are combined by a first optical polarization combiner, and output light beams from third and fourth laser diodes are combined by a second optical polarization combiner. Combined light beams from the first and second optical polarization combiners are multiplexed by an optical multiplexer/demultiplexer into a light beam, which is demultiplexed thereby into first and second pumping light beams to be applied to first and second rare-earth-doped fibers in upstream and downstream optical direct amplifiers. In another arrangement, output light beams from first and second laser diodes are multiplexed and demultiplexed by a first optical multiplexer/demultiplexer into pumping light beams to be applied as backward-pumping light beams to first and second rare-earth-doped fibers, and output light beams from third and fourth laser diodes are multiplexed and demultiplexed by a second optical multiplexer/demultiplexer into pumping light beams to be applied as forward-pumping light beams to the first and second rare-earth-doped fibers in upstream and downstream bidirectionally pumped optical direct amplifiers. The laser diodes are controlled by respective control circuits to produce output light beams at a constant level.

13 Claims, 6 Drawing Sheets

OPTICAL DIRECT AMPLIFIER DEVICE AND BIDIRECTIONALLY PUMPED OPTICAL DIRECT AMPLIFIER DEVICE

BACKGROUND OF THE INVENTION

1. Field of the Invention

The present invention relates to an optical amplifier for use in an optical transmission system, and more particularly to an optical direct amplifier device and a bidirectionally pumped optical direct amplifier device.

2. Description of the Related Art

FIG. 1 of the accompanying drawings shows a basic circuit of a conventional optical direct amplifier device. As shown in FIG. 1, the conventional optical direct amplifier device has a rare-earth-doped optical fiber 1a serving as an optical amplification fiber, a WDM (Wavelength Division Multiplexing) coupler 2a, and an optical isolator 4a which are successively connected in the order named from an upstream signal input terminal to an upstream signal output terminal. The conventional optical direct amplifier device also has a rare-earth-doped optical fiber 1b serving as an optical amplification fiber, a WDM coupler 2b, and an optical isolator 4b which are successively connected in the order named from a downstream signal input terminal to a downstream signal output terminal. The WDM couplers 2a, 2b have other input terminals connected respectively to two output terminals of an optical multiplexer/demultiplexer 4 whose two input terminals are connected respectively to laser diodes 6a, 6b. The laser diodes 6a, 6b are connected respectively to control circuits 7a, 7b which control the laser diodes 6a, 6b to emit light at a constant output level.

The conventional optical direct amplifier device has a maximum amplified output level corresponding to the maximum pumping light emission level of a single laser diode. The conventional optical direct amplifier cannot meet demands for amplified output powers higher than the maximum amplified output level.

The conventional optical direct amplifier device is also problematic in that it will be completely out of operation if the two laser diodes 6a, 6b suffer a failure and their light emission is turned off.

FIG. 2 of the of the accompanying drawings shows a basic circuit of a conventional bidirectionally pumped optical direct amplifier device. As shown in FIG. 2, the conventional bidirectionally pumped optical direct amplifier device has a WDM coupler 2a, a rare-earth-doped optical fiber 1a, a WDM coupler 3a, and an optical isolator 4a which are successively connected in the order named from an upstream signal input terminal to an upstream signal output terminal. The WDM couplers 2a, 3a have other input terminals connected respectively to laser diodes 6a, 6c that are connected respectively to control circuits 7a, 7c. The above arrangement serves as an upstream optical direct amplifier. The conventional bidirectionally pumped optical direct amplifier device also has a downstream optical direct amplifier which is identical to the upstream optical direct amplifier.

The conventional bidirectionally pumped optical direct amplifier device is disadvantageous in that the upstream or downstream optical direct amplifier will be completely out of operation if the two laser diodes 6a, 6c or 6b, 6c suffer a failure and their light emission is turned off.

SUMMARY OF THE INVENTION

It is an object of the present invention to provide an optical direct amplifier device which includes optical direct amplifiers capable of producing a high output power level and which allows upstream and downstream optical direct amplifiers to operate even when three out of four laser diodes suffer a failure.

Another object of the present invention is to provide a bidirectionally pumped optical direct amplifier device which allows an upstream/downstream optical direct amplifier to operate even when three out of four laser diodes suffer a failure.

An optical direct amplifier device according to the present invention has first and second optical amplification fibers for amplifying respective optical signals transmitted in first and second directions, respectively, first, second, third, and fourth pump light sources for emitting output light beams, a first optical polarization combiner for polarization-combining output light beams emitted from the first and second pump light sources, a second optical polarization combiner for polarization-combining output light beams emitted from the third and fourth pump light sources, and an optical multiplexer/demultiplexer for multiplexing output light beams from the first and second optical polarization combiners into a light beam and demultiplexing the light beam into first and second pumping light beams to be applied to the first and second optical amplification fibers.

The optical direct amplifier device may further comprise a first WDM coupler, a first optical isolator, the first optical amplification fiber, the first WDM coupler, and the first optical isolator being successively connected in the order named from an upstream signal input terminal to an upstream signal output terminal, a second WDM coupler, and a second optical isolator, the second optical amplification fiber, the second WDM coupler, and the second optical isolator being successively connected in the order named from a downstream signal input terminal to a downstream signal output terminal, the first and second WDM couplers having input terminals connected respectively to two output terminals of the optical multiplexer/demultiplexer, the optical multiplexer/demultiplexer having two input terminals connected respectively to output terminals of the first and second optical polarization combiners.

The first WDM coupler may comprise a coupler for applying the first pumping light beam to the first optical amplification fiber in an opposite direction to an optical signal supplied from the upstream signal input terminal, and the second WDM coupler comprises a coupler for applying the second pumping light beam to the second optical amplification fiber in an opposite direction to an optical signal supplied from the downstream signal input terminal.

Alternatively, the optical direct amplifier device may further comprise a first WDM coupler, a first optical isolator, the first WDM coupler, the first optical amplification fiber, and the first optical isolator being successively connected in the order named from an upstream signal input terminal to an upstream signal output terminal, a second WDM coupler, and a second optical isolator, the second WDM coupler, the second optical amplification fiber, and the second optical isolator being successively connected in the order named from a downstream signal input terminal to a downstream signal output terminal, the first and second WDM couplers having input terminals connected respectively to two output terminals of the optical multiplexer/demultiplexer, the optical multiplexer/demultiplexer having two input terminals connected respectively to output terminals of the first and second optical polarization combiners.

The first WDM coupler may comprise a coupler for applying the first pumping light beam to the first optical amplification fiber in the same direction as an optical signal supplied from the upstream signal input terminal, and the second WDM coupler comprises a coupler for applying the second pumping light beam to the second optical amplification fiber in the same direction as an optical signal supplied from the downstream signal input terminal.

The optical direct amplifier device may further comprise control circuits connected respectively to said first, second, third, and fourth pump light sources for emitting said output light beams at a constant level.

The optical direct amplifier device includes optical direct amplifiers capable of producing a high output power level and allows upstream and downstream optical direct amplifiers to operate even when three out of the four pump light sources suffer a failure.

In the optical direct amplifier device, the output light beams from the pump light sources are combined by the optical polarization combiners, and combined light beams from the optical polarization combiners are multiplexed and demultiplexed by the optical multiplexer/demultiplexers into pumping light beams to the applied to the optical amplification fibers in optical direct amplifiers. The pump light sources are controlled by the control circuits to emit a light beam at a constant level.

The optical direct amplifiers can produce a high output power level and can be kept in operation even when some of the pump light sources fail.

A bidirectionally pumped optical direct amplifier device according to the present invention comprises first and second optical amplification fibers for amplifying respective optical signals transmitted in first and second directions, respectively, first, second, third, and fourth pump light sources for emitting output light beams, a first optical multiplexer/demultiplexer for multiplexing output light beams from the first and second pump light sources into a light beam and demultiplexing the light beam into first and second pumping light beams to be applied to the first and second optical amplification fibers, and a second optical multiplexer/demultiplexer for multiplexing output light beams from the third and fourth pump light sources into a light beam and demultiplexing the light beam into third and fourth pumping light beams to be applied to the third and fourth optical amplification fibers in an opposite direction to the first optical multiplexer/demultiplexer.

The bidirectionally pumped optical direct amplifier device may further comprise a first WDM coupler, a third WDM coupler, a first optical isolator, the first WDM coupler, the first optical amplification fiber, the third WDM coupler, and the first optical isolator being successively connected in the order named from an upstream signal input terminal to an upstream signal output terminal, a second WDM coupler, a fourth WDM coupler, and a second optical isolator, the second WDM coupler, the second optical amplification fiber, the fourth WDM coupler, and the second optical isolator being successively connected in the order named from a downstream signal input terminal to a downstream signal output terminal, the first and second WDM couplers having input terminals connected respectively to two output terminals of the second optical multiplexer/demultiplexer, the third and fourth WDM couplers having input terminals connected respectively to two output terminals of the first optical multiplexer/demultiplexer, the first optical multiplexer/demultiplexer having two input terminals connected respectively to the first and second pump light sources, the second optical multiplexer/demultiplexer having two input terminals connected respectively to the third and fourth pump light sources.

Alternatively, the bidirectionally pumped optical direct amplifier device may further comprise a first WDM coupler, a third WDM coupler, a first optical isolator, the first WDM coupler, the first optical amplification fiber, the third WDM coupler, and the first optical isolator being successively connected in the order named from an upstream signal input terminal to an upstream signal output terminal, a second WDM coupler, a fourth WDM coupler, and a second optical isolator, the second WDM coupler, the second optical amplification fiber, the fourth WDM coupler, and the second optical isolator being successively connected in the order named from a downstream signal input terminal to a downstream signal output terminal, the first and fourth WDM couplers having input terminals connected respectively to two output terminals of the second optical multiplexer/demultiplexer, the second and third WDM couplers having input terminals connected respectively to two output terminals of the first optical multiplexer/demultiplexer, the first optical multiplexer/demultiplexer having two input terminals connected respectively to the first and second pump light sources, the second optical multiplexer/demultiplexer having two input terminals connected respectively to the third and fourth pump light sources.

The first WDM coupler may comprise a coupler for applying the third pumping light beam to the first optical amplification fiber in the same direction as an optical signal supplied from the upstream signal input terminal, the second WDM coupler comprises a coupler for applying the fourth pumping light beam to the second optical amplification fiber in the same direction as an optical signal supplied from the downstream signal input terminal, the third WDM coupler comprises a coupler for applying the first pumping light beam to the first optical amplification fiber in an opposite direction to an optical signal supplied from the upstream signal input terminal, and the fourth WDM coupler comprises a coupler for applying the second pumping light beam to the second optical amplification fiber in an opposite direction to an optical signal supplied from the downstream signal input terminal.

The first WDM coupler may comprise a coupler for applying the third pumping light beam to the first optical amplification fiber in the same direction as an optical signal supplied from the upstream signal input terminal, the second WDM coupler comprises a coupler for applying the second pumping light beam to the second optical amplification fiber in the same direction as an optical signal supplied from the downstream signal input terminal, the third WDM coupler comprises a coupler for applying the first pumping light beam to the first optical amplification fiber in an opposite direction to an optical signal supplied from the upstream signal input terminal, and the fourth WDM coupler comprises a coupler for applying the fourth pumping light beam to the second optical amplification fiber in an opposite direction to an optical signal supplied from the downstream signal input terminal.

The bidirectionally pumped optical direct amplifier device may further comprise control circuits connected respectively to the first, second, third, and fourth pump light sources for emitting the output light beams at a constant level.

According to the present invention, there is also provided a bidirectionally pumped optical direct amplifier device comprising first and second optical amplification fibers for amplifying respective optical signals transmitted in first and second directions, respectively, first, second, third, and fourth pump light sources for emitting output light beams, a first optical multiplexer/demultiplexer for multiplexing output light beams from the first and second pump light sources into a light beam and demultiplexing the light beam into first and second pumping light beams to be applied to the first and second optical amplification fibers, and means for applying an output light beam from the third pump light source to the first optical amplification fiber and an output light beam from the fourth pump light source to the second optical amplification fiber in an opposite direction to the first optical multiplexer/demultiplexer.

In the bidirectionally pumped optical direct amplifier device, even if three out of the four pump light sources suffer a failure, upstream and downstream optical direct amplifiers are kept in operation.

The output light beams from the first and second pump light sources are multiplexed and demultiplexed by the first optical multiplexer/demultiplexer into pumping light beams to be applied as backward-pumping light beams to the first and second rare-earth-doped fibers, and the output light beams from the third and fourth laser pump light sources are multiplexed and demultiplexed by the second optical multiplexer/demultiplexer into pumping light beams to be applied as forward-pumping light beams to the first and second rare-earth-doped fibers in upstream and downstream bidirectionally pumped optical direct amplifiers. The laser diodes are controlled by the respective control circuits to produce output light beams at a constant level. The optical direct amplifiers are kept in operation even when some of the pump light sources suffer a failure.

The above and other objects, features, and advantages of the present invention will become apparent from the following description with reference to the accompanying drawings which illustrate examples of the present invention.

DETAILED DESCRIPTION OF THE PREFERRED EMBODIMENTS

1st Embodiment

Figure 1:
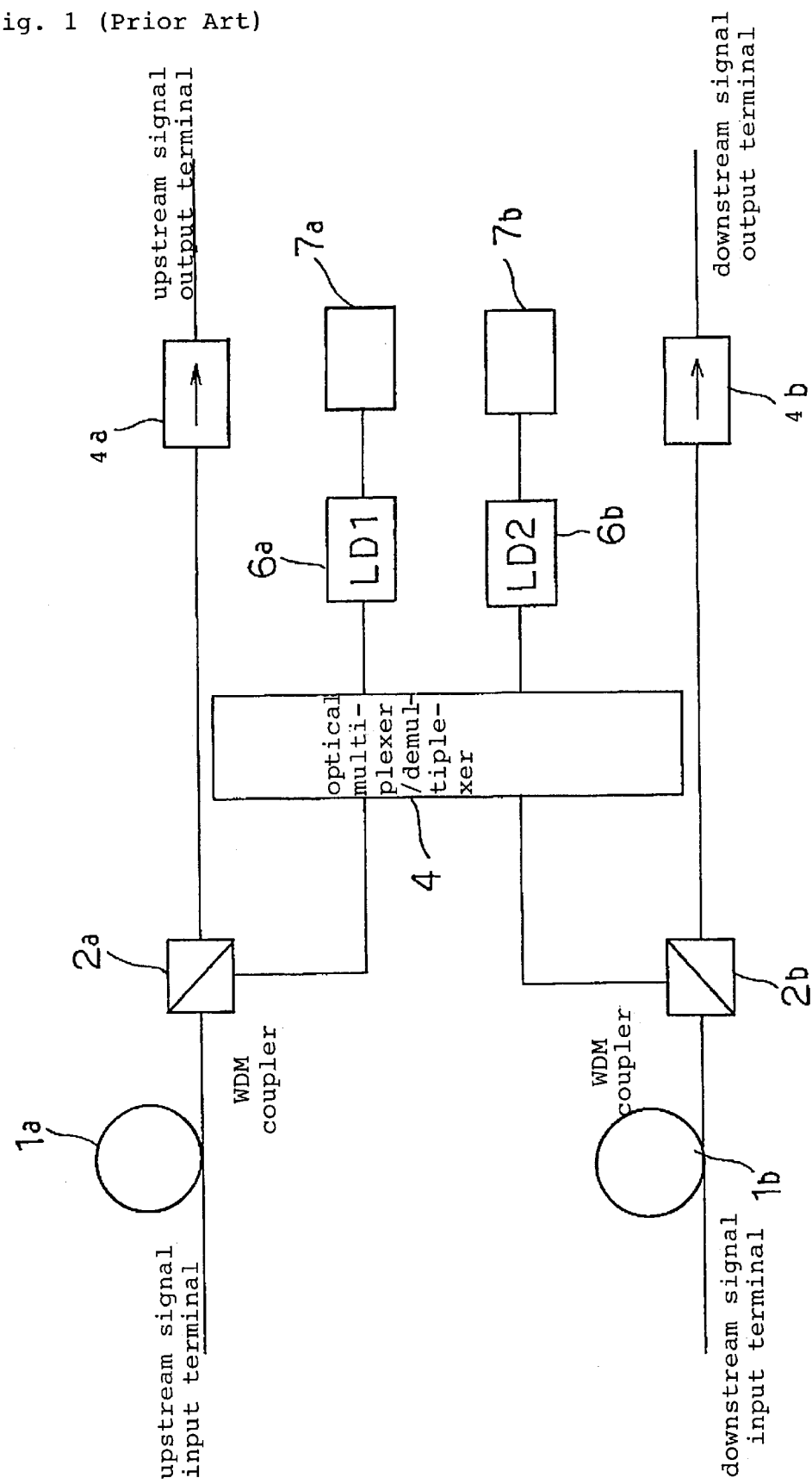
FIG. 1 is a block diagram of a basic circuit of a conventional optical direct amplifier device.
Figure 2:
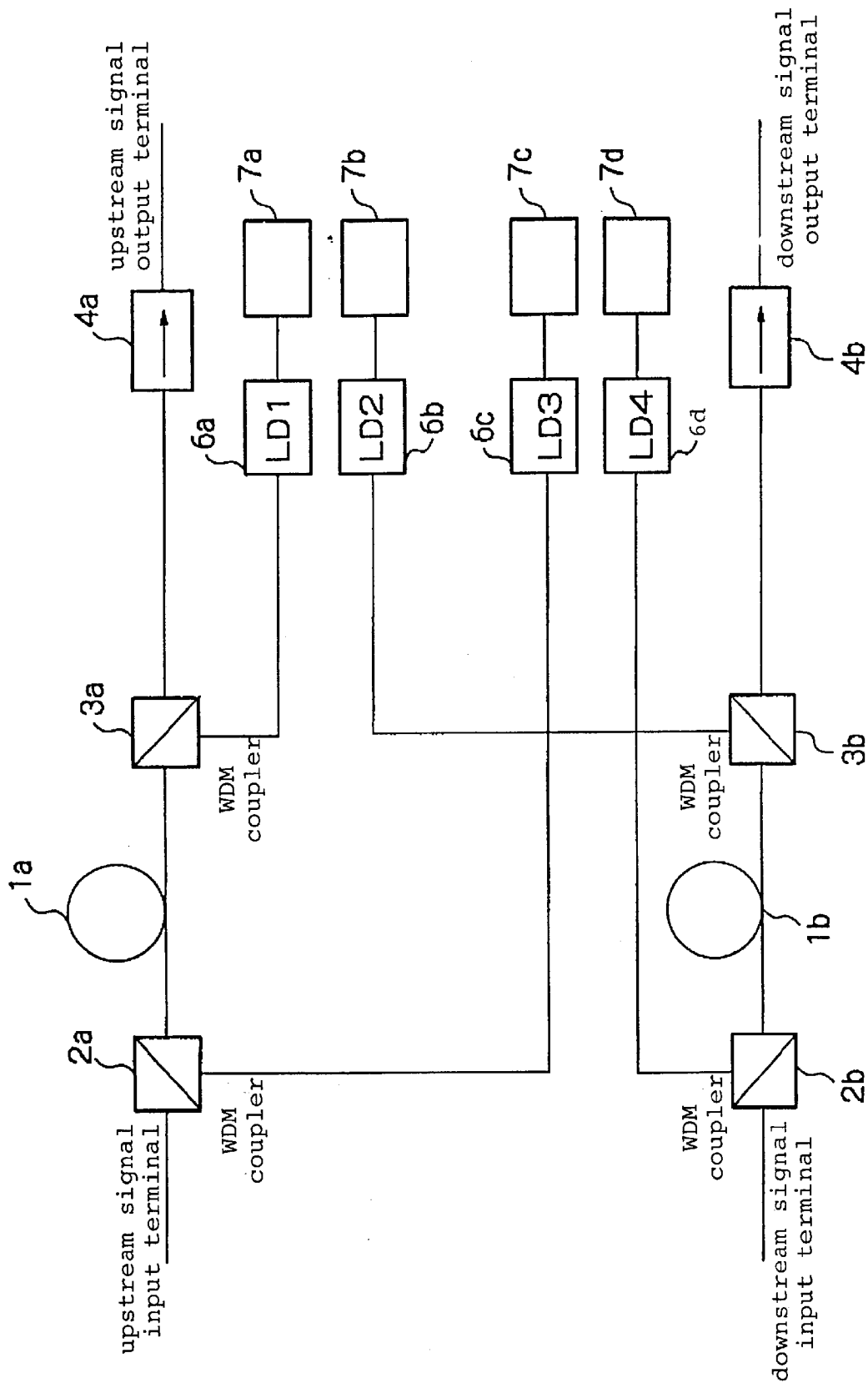
FIG. 2 is a block diagram of a basic circuit of a conventional bidirectionally pumped optical direct amplifier device.
Figure 3:
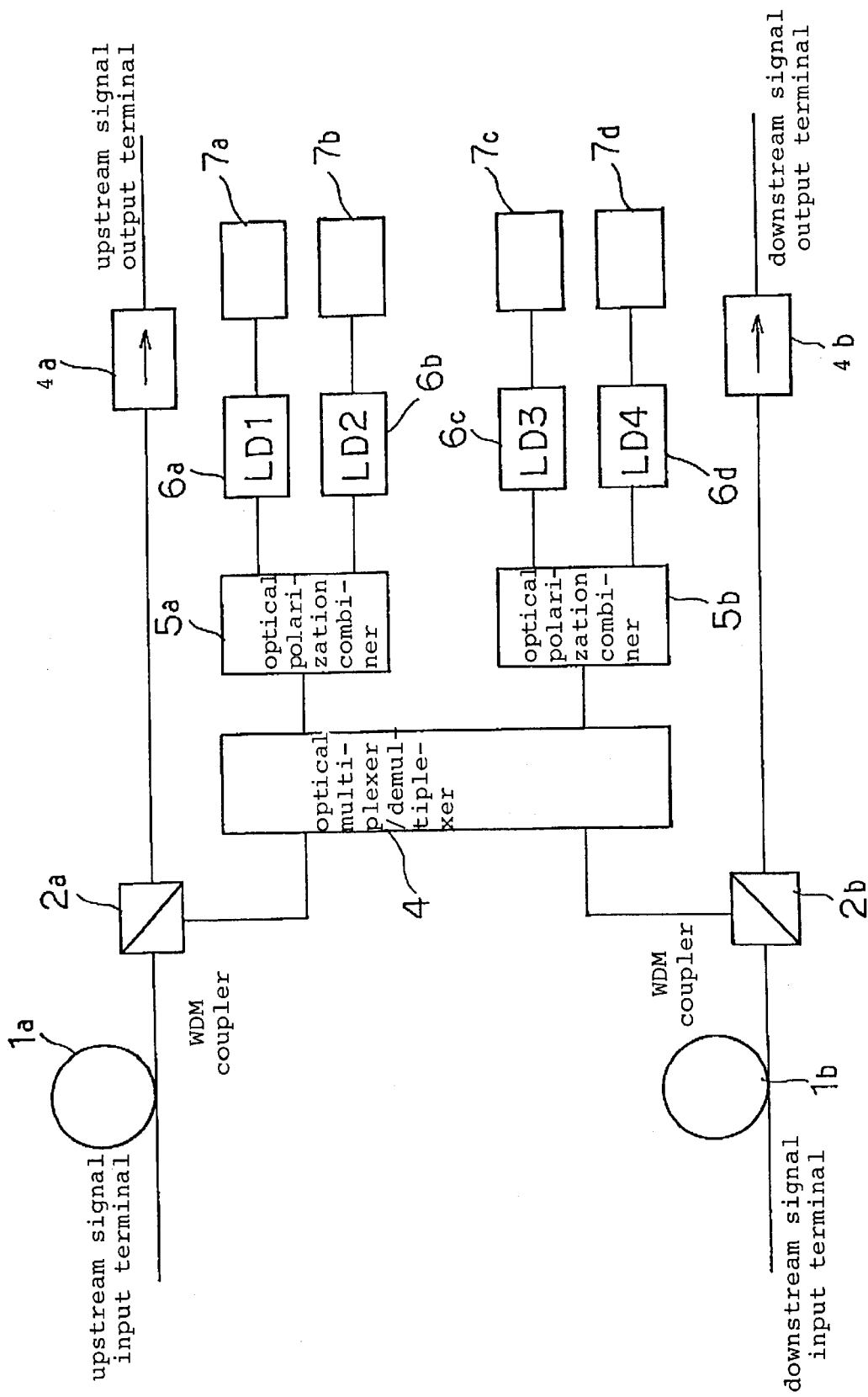
FIG. 3 is a block diagram of a basic circuit of an optical direct amplifier device according to a first embodiment of the present invention.

FIG. 3 shows in block form a basic circuit of an optical direct amplifier device according to a first embodiment of the present invention. As shown in FIG. 3, the optical direct amplifier device according to the first embodiment has a rare-earth-doped optical fiber 1a serving as an optical amplification fiber, a WDM coupler 2a, and an optical isolator 4a which are successively connected in the order named from an upstream signal input terminal to an upstream signal output terminal. The optical direct amplifier device also has a rare-earth-doped optical fiber 1b serving as an optical amplification fiber, a WDM coupler 2b, and an optical isolator 4b which are successively connected in the order named from a downstream signal input terminal to a downstream signal output terminal. The WDM couplers 2a, 2b have other input terminals connected respectively to two output terminals of an optical multiplexer/demultiplexer 4 whose two input terminals are connected respectively to output terminals of optical polarization combiners 5a, 5b. An optical polarization combiner is an optical combiner for polarization-combining two input light beams to produce an output level which is equal to the sum of the levels of the input light beams. The optical polarization combiner 5a has two input terminals connected respectively to laser diodes 6a, 6b as pump light sources, and the optical polarization combiner 5b has two input terminals connected respectively to laser diodes 6c, 6d as pump light sources. The laser diodes 6a–6d are connected respectively to control circuits 7a–7d which control the laser diodes 6a–6d to emit light at a constant output level.

Operation of the optical direct amplifier device according to the first embodiment will be described below with reference to FIG. 3.

In FIG. 3, respective output laser beams emitted form the laser diodes 6a, 6b are multiplexed by the optical polarization combiner 5a, and respective output laser beams emitted form the laser diodes 6c, 6d are multiplexed by the optical polarization combiner 5b. Since each of the optical polarization combiners 5a, 5b polarization-combines two input light beams to produce an output level which is equal to the sum of the levels of the input light beams, it can output pumping power at a level equal to the sum of the levels of the output light beams from two laser diodes. The output light beams from the optical polarization combiners 5a, 5b are multiplexed by the optical multiplexer/demultiplexer 4, which applies the multiplexed light beams to the upstream and downstream rare-earth-doped optical fibers 1a, 1b at the WDM couplers 2a, 2b in the direction opposite to optical signals supplied from the upstream and downstream signal input terminals. The optical signals supplied from the upstream and downstream signal input terminals are amplified by the rare-earth-doped optical fibers 1a, 1b, and outputted from the upstream and downstream signal output terminals. At this time, the laser diodes 6a–6d are controlled by the respective control circuits 7a–7d emit light at a constant output level.

If three out of the four laser diodes 6a–6d suffers a failure and their light emission is turned off, then the remaining operational laser diode provides a backward-pumping light source for both the upstream and downstream optical direct amplifiers thereby to keep the optical direct amplifier device in operation.

2nd Embodiment

Figure 4:
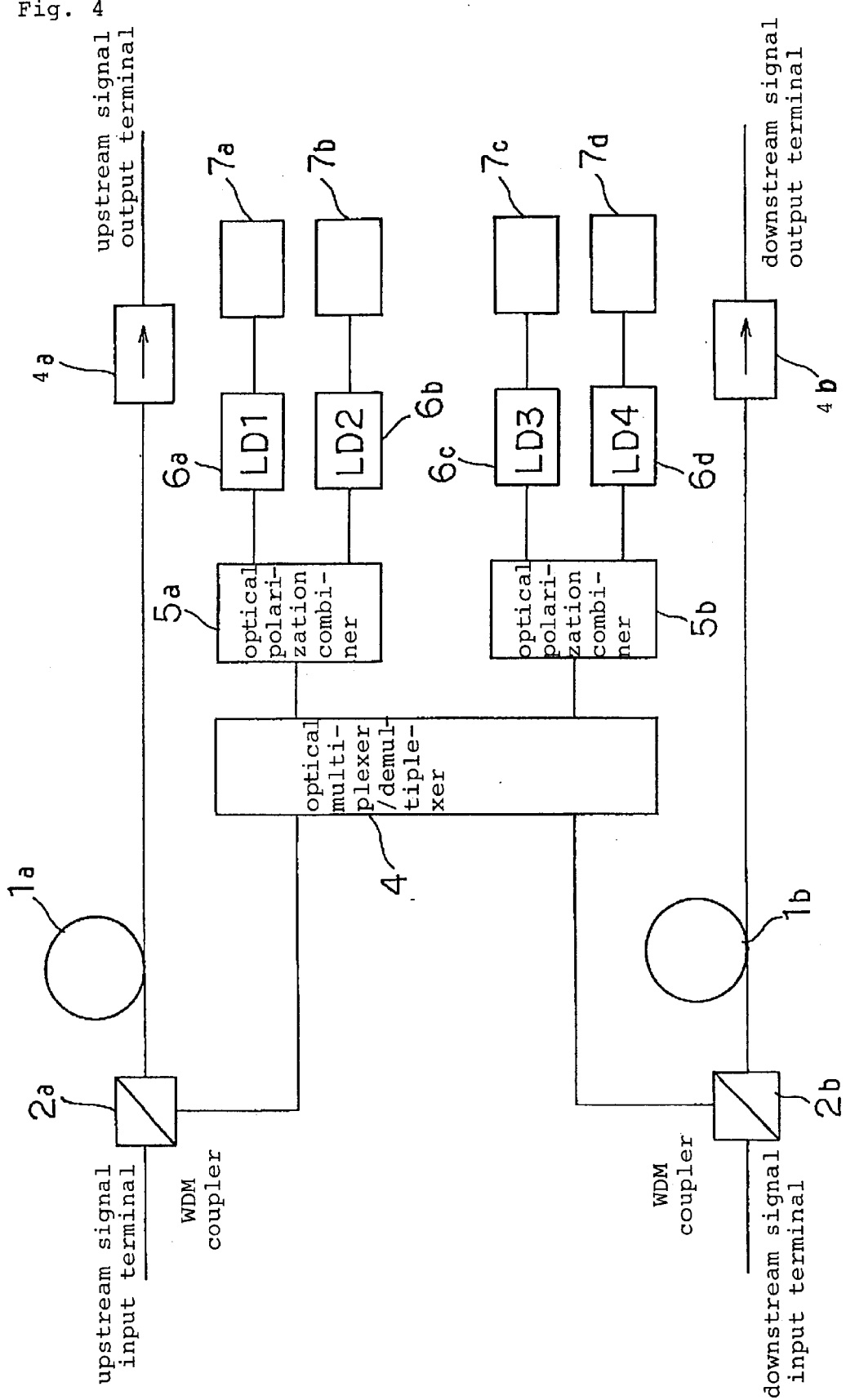
FIG. 4 is a block diagram of a basic circuit of an optical direct amplifier device according to a second embodiment of the present invention.

FIG. 4 shows in block form an optical direct amplifier device according to a second embodiment of the present invention. As shown in FIG. 4, the optical direct amplifier device according to the second embodiment has a WDM coupler 2a, a rare-earth-doped optical fiber 1a serving as an optical amplification fiber, and an optical isolator 4a which are successively connected in the order named from an upstream signal input terminal to an upstream signal output terminal. The optical direct amplifier device also has a WDM coupler 2b, a rare-earth-doped optical fiber 1b serving as an optical amplification fiber, and an optical isolator 4b which are successively connected in the order named from a downstream signal input terminal to a downstream signal output terminal. The WDM couplers 2a, 2b have other input terminals connected respectively to two output terminals of an optical multiplexer/demultiplexer 4 whose two input terminals are connected respectively to output terminals of optical polarization combiners 5a, 5b. The optical polarization combiner 5a has two input terminals connected respectively to laser diodes 6a, 6b as pump light sources, and the optical polarization combiner 5b has two input terminals connected respectively to laser diodes 6c, 6d as pump light sources. The arrangement shown in FIG. 4 provides forward-pumping optical amplifiers which apply pumping light beams in the same direction as optical signals supplied from respective input terminals. The laser diodes 6a–6d are connected respectively to control circuits 7a–7d which control the laser diodes 6a–6d to emit light at a constant output level.

In FIGS. 3 and 4, the control circuits 7a–7d are connected respectively to the laser diodes 6a–6d. However, one control circuit may be used to control two or more laser diodes.

The first and second embodiments described above offer an advantage in that the optical direct amplifier device generates a high output level. This is because the light beams emitted from two laser diodes are combined by an optical polarization combiner and then the combined light beam is applied to an optical amplification fiber. Therefore, the optical direct amplifier device has a maximum amplified output level corresponding to the maximum pumped light emission level of the two laser diodes.

The first and second embodiments described above offer another advantage in that the upstream and downstream optical direct amplifiers can be kept in operation even if three out of the four laser diodes fail to operate. The reason for this is that the output light beams from two of the four laser diodes are combined by the first polarization combiner and the output light beams from the other two of the four laser diodes are combined by the second polarization combiner, and these combined light beams are applied as pumping light beams to the upstream and downstream optical amplification fibers. Thus, the optical direct amplifier device according to the first and second embodiments provide laser diode redundancy for continuous amplifier operation in the case of a laser diode failure.

3rd Embodiment

Figure 5:
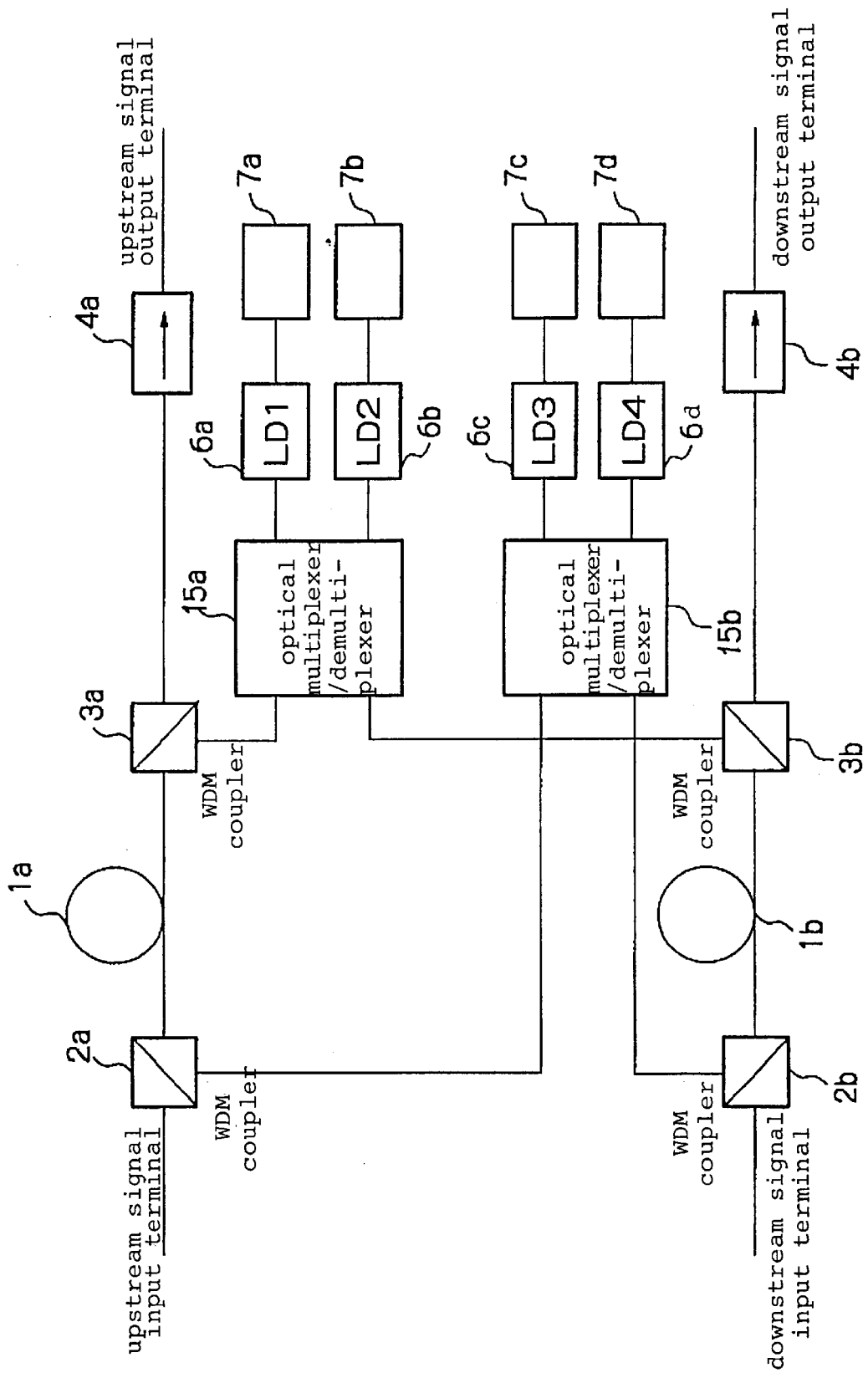
FIG. 5 is a block diagram of a basic circuit of a bidirectionally pumped optical direct amplifier device according to a third embodiment of the present invention.

FIG. 5 shows in block form a basic circuit of a bidirectionally pumped optical direct amplifier device according to a third embodiment of the present invention.

As shown in FIG. 5, the bidirectionally pumped optical direct amplifier device according to the third embodiment has a WDM coupler 2a, a rare-earth-doped optical fiber 1a serving as an optical amplification fiber, a WDM coupler 3a, and an optical isolator 4a which are successively connected in the order named from an upstream signal input terminal to an upstream signal output terminal. The bidirectionally pumped optical direct amplifier device also has a WDM coupler 2b, a rare-earth-doped optical fiber 1b serving as an optical amplification fiber, a WDM coupler 3b, and an optical isolator 4b which are successively connected in the order named from a downstream signal input terminal to a downstream signal output terminal. Each of the WDM couplers serves as a coupler for applying a pumping light beam to the rare-earth-doped optical fiber. The WDM couplers 2a, 2b have other input terminals connected respectively to two output terminals of an optical multiplexer/demultiplexer 15b, and the WDM couplers 3a, 3b have other input terminals connected respectively to two output terminals of an optical multiplexer/demultiplexer 15a. The optical multiplexer/demultiplexer 15a has two input terminals connected respectively to laser diodes 6a, 6b as pump light sources, and the optical multiplexer/demultiplexer 15b has two input terminals connected respectively to laser diodes 6c, 6d as pump light sources. The laser diodes 6a–6d are connected respectively to control circuits 7a–7d which control the laser diodes 6a–6d to emit light at a constant output level.

Operation of the bidirectionally bumped optical direct amplifier device according to the first embodiment will be described below with reference to FIG. 3.

Optical signals supplied from the upstream and downstream signal input terminals are amplified by optical amplification fibers 1a, 1b, and outputted from the upstream and downstream signal output terminals. At this time, output light beams from the laser diodes 6a, 6b are multiplexed by the optical multiplexer/demultiplexer 15a into a multiplexed light beam which serves as a backward-pumping light beam for the rare-earth-doped fibers 1a, 1b, and output light beams from the laser diodes 6c, 6d are multiplexed by the optical multiplexer/demultiplexer 15b into a multiplexed light beam which serves as a forward-pumping light beam for the rare-earth-doped fibers 1a, 1b. Thus, the arrangement shown in FIG. 5 provides upstream and downstream bidirectionally pumped optical direct amplifiers. The laser diodes 6a–6d are controlled by the respective control circuits 7a–7d emit light at a constant output level.

If the laser diodes 6a, 6c or the laser diodes 6b, 6d suffer a failure and their light emission is turned off, then since the remaining laser diodes in the pairs connected to the optical multiplexer/demultiplexers 15a, 15b are operational, they provide bidirectionally-pumping light sources for both the upstream and downstream optical direct amplifiers thereby to keep the optical direct amplifier device in operation. In conventional bidirectionally pumped optical direct amplifier devices which are free of optical multiplexer/demultiplexers, however, the upstream or downstream optical direct amplifier is completely out of operation.

If three out of the four laser diodes 6a–6d suffers a failure and their light emission is turned off, then the remaining operational laser diode provides a forward- or backward-pumping light source for both the upstream and downstream optical direct amplifiers thereby to keep the optical direct amplifier device in operation.

4th Embodiment

Figure 6:
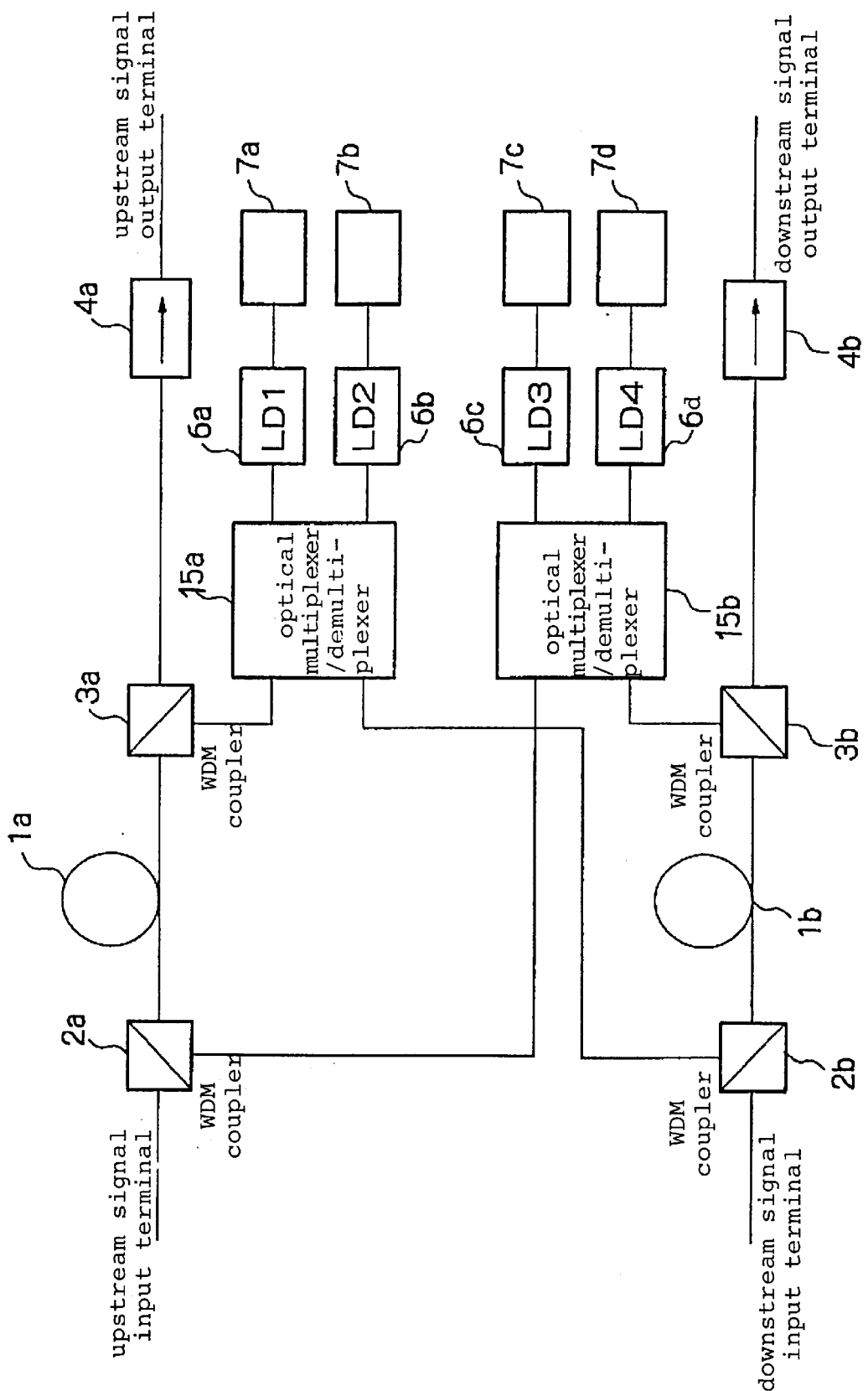
FIG. 6 is a block diagram of a basic circuit of a bidirectionally pumped optical direct amplifier device according to a fourth embodiment of the present invention.

FIG. 6 shows in block form a basic circuit of a bidirectionally pumped optical direct amplifier device according to a fourth embodiment of the present invention.

The bidirectionally pumped optical direct amplifier device according to the fourth embodiment shown in FIG. 6 is basically the same as the bidirectionally pumped optical direct amplifier device according to the third embodiment shown in FIG. 5 except that the other input terminals of the WDM couplers 2a, 3b are connected to the respective output terminals of the optical multiplexer/demultiplexer 15b, and the other input terminals of the WDM couplers 2b, 3a are connected to the respective output terminals of the optical multiplexer/demultiplexer 15a.

In operation, optical signals supplied from the upstream and downstream signal input terminals are amplified by optical amplification fibers 1a, 1b, and outputted from the upstream and downstream signal output terminals. At this time, output light beams from the laser diodes 6a, 6b are multiplexed by the optical multiplexer/demultiplexer 15a into a multiplexed light beam which serves as a backward-pumping light beam for the rare-earth-doped fiber 1a and a forward-pumping light beam for the rare-earth-doped fiber 1b, and output light beams from the laser diodes 6c, 6d are multiplexed by the optical multiplexer/demultiplexer 15b into a multiplexed light beam which serves as a forward-pumping light beam for the rare-earth-doped fiber 1a and a backward-pumping light beam for the rare-earth-doped fiber 1b. Thus, the arrangement shown in FIG. 6 provides upstream and downstream bidirectionally pumped optical direct amplifiers. The laser diodes 6a–6d are controlled by the respective control circuits 7a–7d emit light at a constant output level.

Thus, the bidirectionally pumped optical direct amplifier device according to each of the third and fourth embodiments provides laser diode redundancy for continuous amplifier operation in the case of a laser diode failure.

In FIGS. 5 and 6, the control circuits 7a–7d are connected respectively to the laser diodes 6a–6d. However, one control circuit may be used to control two or more laser diodes.

If either one of the optical multiplexer/demultiplexers 15a, 15b were dispensed with and the corresponding laser diodes were directly connected to the WDM couplers, with only one set of laser diodes being in a redundant arrangement, then the upstream and downstream optical direct amplifiers would not be kept in operation unless there laser diodes including those two in the redundant arrangement would suffer a failure.

According to the third and fourth embodiments, however, the upstream and downstream optical direct amplifiers are kept in operation even if three out of the four laser diodes suffer a failure, because the output light beams from two of the four laser diodes are multiplexed by one of the two optical multiplexer/demultiplexers into a backward-pumping light beam and the output light beams from the other two of the four laser diodes are multiplexed by the other optical multiplexer/demultiplexer into a forward-pumping light beam, thereby providing laser diode redundancy for continuous amplifier operation in the case of a laser diode failure.

While preferred embodiments of the present invention have been described using specific terms, such description is for illustrative purposes only, and it is to be understood that changes and variations may be made without departing from the spirit or scope of the following claims.

What is claimed is:

1. An optical direct amplifier device comprising:
    first and second optical amplification fibers for amplifying respective optical signals transmitted in first and second directions, respectively;
    first, second, third, and fourth pump light sources for emitting output light beams;
    a first optical polarization combiner for polarization-combining output light beams emitted from said first and second pump light sources;
    a second optical polarization combiner for polarization-combining output light beams emitted from said third and fourth pump light sources; and
    an optical multiplexer/demultiplexer for multiplexing output light beams from said first and second optical polarization combiners into a light beam and demultiplexing the light beam into first and second pumping light beams to be applied to said first and second optical amplification fibers.

2. An optical direct amplifier device according to claim 1, further comprising:
    a first WDM coupler;
    a first optical isolator;
    said first optical amplification fiber, said first WDM coupler, and said first optical isolator being successively connected in the order named from an upstream signal input terminal to an upstream signal output terminal;
    a second WDM coupler; and
    a second optical isolator;
    said second optical amplification fiber, said second WDM coupler, and said second optical isolator being successively connected in the order named from a downstream signal input terminal to a downstream signal output terminal;
    said first and second WDM couplers having input terminals connected respectively to two output terminals of said optical multiplexer/demultiplexer, said optical multiplexer/demultiplexer having two input terminals connected respectively to output terminals of said first and second optical polarization combiners.

3. An optical direct amplifier device according to claim 2, wherein said first WDM coupler comprises a coupler for applying said first pumping light beam to said first optical amplification fiber in an opposite direction to an optical signal supplied from said upstream signal input terminal, and said second WDM coupler comprises a coupler for applying said second pumping light beam to said second optical amplification fiber in an opposite direction to an optical signal supplied from said downstream signal input terminal.

4. An optical direct amplifier device according to claim 1, further comprising:
    a first WDM coupler;
    a first optical isolator;
    said first WDM coupler, said first optical amplification fiber, and said first optical isolator being successively connected in the order named from an upstream signal input terminal to an upstream signal output terminal;
    a second WDM coupler; and
    a second optical isolator;
    said second WDM coupler, said second optical amplification fiber, and said second optical isolator being successively connected in the order named from a downstream signal input terminal to a downstream signal output terminal;
    said first and second WDM couplers having input terminals connected respectively to two output terminals of said optical multiplexer/demultiplexer, said optical multiplexer/demultiplexer having two input terminals connected respectively to output terminals of said first and second optical polarization combiners.

5. An optical direct amplifier device according to claim 4, wherein said first WDM coupler comprises a coupler for applying said first pumping light beam to said first optical amplification fiber in the same direction as an optical signal supplied from said upstream signal input terminal, and said second WDM coupler comprises a coupler for applying said second pumping light beam to said second optical amplification fiber in the same direction as an optical signal supplied from said downstream signal input terminal.

6. An optical direct amplifier device according to claim 1, further comprising:
    control circuits connected respectively to said first, second, third, and fourth pump light sources for emitting said output light beams at a constant level.

7. A bidirectionally pumped optical direct amplifier device comprising:

first and second optical amplification fibers for amplifying respective optical signals transmitted in first and second directions, respectively;

first, second, third, and fourth pump light sources for emitting output light beams;

a first optical multiplexer/demultiplexer for multiplexing output light beams from said first and second pump light sources into a light beam and demultiplexing the light beam into first and second pumping light beams to be applied to said first and second optical amplification fibers; and a second optical multiplexer/demultiplexer for multiplexing output light beams from said third and fourth pump light sources into a light beam and demultiplexing the light beam into third and fourth pumping light beams to be applied to said third and fourth optical amplification fibers in an opposite direction to the first optical multiplexer/demultiplexer.

8. A bidirectionally pumped optical direct amplifier device according to claim 7, further comprising:

a first WDM coupler;

a third WDM coupler;

a first optical isolator;

said first WDM coupler, said first optical amplification fiber, said third WDM coupler, and said first optical isolator being successively connected in the order named from an upstream signal input terminal to an upstream signal output terminal;

a second WDM coupler;

a fourth WDM coupler; and a second optical isolator;

said second WDM coupler, said second optical amplification fiber, said fourth WDM coupler, and said second optical isolator being successively connected in the order named from a downstream signal input terminal to a downstream signal output terminal;

said first and second WDM couplers having input terminals connected respectively to two output terminals of said second optical multiplexer/demultiplexer;

said third and fourth WDM couplers having input terminals connected respectively to two output terminals of said first optical multiplexer/demultiplexer;

said first optical multiplexer/demultiplexer having two input terminals connected respectively to said first and second pump light sources;

said second optical multiplexer/demultiplexer having two input terminals connected respectively to said third and fourth pump light sources.

9. A bidirectionally pumped optical direct amplifier device according to claim 7, further comprising:

a first WDM coupler;

a third WDM coupler;

a first optical isolator;

said first WDM coupler, said first optical amplification fiber, said third WDM coupler, and said first optical isolator being successively connected in the order named from an upstream signal input terminal to an upstream signal output terminal;

a second WDM coupler;

a fourth WDM coupler; and a second optical isolator;

said second WDM coupler, said second optical amplification fiber, said fourth WDM coupler, and said second optical isolator being successively connected in the order named from a downstream signal input terminal to a downstream signal output terminal;

said first and fourth WDM couplers having input terminals connected respectively to two output terminals of said second optical multiplexer/demultiplexer;

said second and third WDM couplers having input terminals connected respectively to two output terminals of said first optical multiplexer/demultiplexer;

said first optical multiplexer/demultiplexer having two input terminals connected respectively to said first and second pump light sources;

said second optical multiplexer/demultiplexer having two input terminals connected respectively to said third and fourth pump light sources.

10. A bidirectionally pumped optical direct amplifier device according to claim 8, wherein said first WDM coupler comprises a coupler for applying said third pumping light beam to said first optical amplification fiber in the same direction as an optical signal supplied from said upstream signal input terminal, said second WDM coupler comprises a coupler for applying said fourth pumping light beam to said second optical amplification fiber in the same direction as an optical signal supplied from said downstream signal input terminal, said third WDM coupler comprises a coupler for applying said first pumping light beam to said first optical amplification fiber in an opposite direction to an optical signal supplied from said upstream signal input terminal, and said fourth WDM coupler comprises a coupler for applying said second pumping light beam to said second optical amplification fiber in an opposite direction to an optical signal supplied from said downstream signal input terminal.

11. A bidirectionally pumped optical direct amplifier device according to claim 9, wherein said first WDM coupler comprises a coupler for applying said third pumping light beam to said first optical amplification fiber in the same direction as an optical signal supplied from said upstream signal input terminal, said second WDM coupler comprises a coupler for applying said second pumping light beam to said second optical amplification fiber in the same direction as an optical signal supplied from said downstream signal input terminal, said third WDM coupler comprises a coupler for applying said first pumping light beam to said first optical amplification fiber in an opposite direction to an optical signal supplied from said upstream signal input terminal, and said fourth WDM coupler comprises a coupler for applying said fourth pumping light beam to said second optical amplification fiber in an opposite direction to an optical signal supplied from said downstream signal input terminal.

12. A bidirectionally pumped optical direct amplifier device according to claim 7, further comprising:

control circuits connected respectively to said first, second, third, and fourth pump light sources for emitting said output light beams at a constant level.

13. A bidirectionally pumped optical direct amplifier device comprising:

first and second optical amplification fibers for amplifying respective optical signals transmitted in first and second directions, respectively;

first, second, third, and fourth pump light sources for emitting output light beams;

a first optical multiplexer/demultiplexer for multiplexing output light beams from said first and second pump light sources into a light beam and demultiplexing the light beam into first and second pumping light beams to be applied to said first and second optical amplification fibers; and means for applying an output light beam from said third pump light source to said first optical amplification fiber and an output light beam from said fourth pump light source to said second optical amplification fiber in an opposite direction to said first optical multiplexer/demultiplexer.

* * * * *